(12) United States Patent
Hsia

(10) Patent No.: US 6,452,235 B1
(45) Date of Patent: Sep. 17, 2002

(54) FLOATING BODY ESD PROTECTION CIRCUIT

(75) Inventor: Liang-Choo Hsia, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 17 days.

(21) Appl. No.: 09/664,108

(22) Filed: Sep. 19, 2000

(51) Int. Cl.$^7$ ............................................... H01L 23/62
(52) U.S. Cl. ...................... 257/355; 257/365; 257/173; 361/55; 361/56; 361/57; 361/90; 361/91.1; 361/91.5
(58) Field of Search ................................ 257/355, 347, 257/352, 353, 360, 361, 356, 367, 369, 401, 173; 361/56, 55, 57, 90, 91.1, 91.5, 98

(56) References Cited

U.S. PATENT DOCUMENTS 6,034,854 A * 3/2000 Suga ........................... 361/56
6,153,913 A * 11/2000 Hsu et al. .................... 257/355
6,278,157 B1 * 8/2001 Tran et al. ................... 257/347
6,317,306 B1 * 11/2001 Chen et al. ................... 361/56

FOREIGN PATENT DOCUMENTS

JP 354111645 A * 9/1979

OTHER PUBLICATIONS

Ben G. Streetman and Sanjay Banerjee, Solid State Electronic Devices 2000, Prentice Hall, Inc., Fifth Edition, pp. 75–77.*

Adel S. Sedra and Kenneth C. Smith, Microelectronic Circuits 1998, Oxford University Press, Fourth Edition, pp. 354–356 and 379.*

* cited by examiner

Primary Examiner—Olik Chaudhuri
Assistant Examiner—Dana Farahani
(74) Attorney, Agent, or Firm—Wu & Cheng, LLP; Charles C. H. Wu

(57) ABSTRACT

A floating body ESD protection circuit positioned between and coupled to an I/O pad and an internal circuit. A p-type depletion mode transistor is used to control the body of an n-type enhancement mode transistor. When the p-type depletion mode transistor is triggered, the body of n-type enhancement mode transistor remains grounded. If the p-type depletion mode transistor has not been triggered, the body remains in a floating state, lowering the range of the snapback voltage. As a consequence the ESD protection circuit is able to function more rapidly. Similarly, an n-type depletion mode transistor is used to control the body of a p-type enhancement mode transistor. When the n-type depletion mode transistor is triggered, the body remains coupled to a high voltage. If the n-type depletion mode transistor has not been triggered, the body is in a floating state. Thus, the range of the snapback voltage can be lowered, enabling the ESD protection circuit to function more rapidly.

17 Claims, 6 Drawing Sheets

FLOATING BODY ESD PROTECTION CIRCUIT

BACKGROUND OF THE INVENTION

1. Field of the Invention

The present invention relates to an electrostatic discharge (ESD) protection circuit. More particularly, the present invention relates to a substrate using a depletion mode transistor to control the body of an enhancement mode transistor, in order to assure that the snapback voltage is lowered, thus, fulfilling the function of a floating body ESD protection circuit.

2. Description of the Related Art

During the fabrication and post-fabrication processes of integrated circuits such as dynamic random access memory (DRAM) and static random access memory (SRAM), electrostatic discharge is often the primary cause of chip damage. For example, a person walking over carpet in a high relative humidity environment can generate several hundred to several thousand volts of electricity. When the charged body makes contact with the chip, static electricity may discharge causing irreparable damage to the chip. A number of methods have emerged to prevent damage to chips by electrostatic discharge. The conventional method commonly uses hardware to prevent electrostatic discharge. That is to say, an on-chip electrostatic discharge protection circuit is positioned evenly between an internal circuit and each bonding pad, to protect the internal circuit. FIG. 1 is the circuit diagram of a conventional ESD protection circuit. As shown in FIG. 1, an ESD protection circuit is positioned between an I/O pad and an internal circuit. The ESD protection circuit is used to control the current flow through I/O pad to internal pad 12, so that excessively high, positive and negative voltage is effectively discharged and falls within an appropriate range.

The protection circuit described above consists of a PMOS transistor 14 and an NMOS transistor 16. The source and gate of PMOS transistor 14 are coupled to a voltage VDD. The drain of the NMOS transistor 16 is coupled to the drain of PMOS transistor 14, both are coupled to the I/O pad and internal circuit at connecting point 18. The gate and source of NMOS transistor 16 are alternatively coupled to the grounded voltage VSS. In conventional practice, bulk ESD protection circuits like the one shown in FIG. 1, use gated N-P structures or gate PMOS-gate NMOS combinations. Thus, the body (well or substrate) of PMOS transistor 14 and NMOS transistor 16 are coupled to the top of the source and are respectively coupled to voltage Vdd and grounded voltage Vss.

The above structure allows excessively high snap back voltage Vsb. As shown in FIG. 2, only after the voltage has exceeded snap back voltage, are PMOS transistor 14 and NMOS transistor 16 triggered, allowing the gradual return to normal operating voltage Vop. Thus, when snap back voltage is excessively high, the ESD protection circuit is unable to respond quickly, permitting electrostatic discharge to damage the circuit, causing product failure.

SUMMARY OF THE INVENTION

Accordingly, one object of the present invention is to provide a floating body ESD protection circuit used to lower the range of snapback voltage, which enables the ESD protection circuit to function more rapidly, protecting the internal circuit from the affects of sudden, excessively high voltage.

The present invention provides a floating body ESD protection circuit positioned between and coupled to an input-output pad and an internal circuit. The floating body protection circuit includes the structure constituted by a p-type depletion mode transistor, an n-type depletion mode transistor, a p-type enhancement mode transistor and an n-type enhancement mode transistor.

The gate of p-type depletion mode transistor is coupled to an I/O pad, the source is coupled to a high voltage. The source is coupled to high voltage. The source and gate of p-type enhancement mode transistor are coupled to a high voltage, the drain is coupled to the I/O pad. The body is coupled to the drain of the n-type depletion mode transistor. The source and gate of the n-type enhancement mode transistor are coupled to a grounded voltage, the drain is coupled to I/O pad 30, and the body is coupled to the drain of the p-type depletion mode transistor.

The drain of the n-type depletion mode transistor is coupled to the body of the p-type enhancement mode transistor. Thus, when the n-type depletion mode transistor is triggered, high voltage is passed to the body of the p-type enhancement mode transistor. Alternatively, when the n-type depletion mode has been triggered, the p-type enhancement mode transistor remains in a floating state. Thus, the range of the snapback voltage can be lowered, enabling the ESD protection circuit to respond sooner.

Similarly, because the drain of the p-type enhancement mode transistor is coupled to the body of the n-type enhancement mode transistor, when the p-type depletion mode transistor is triggered, grounded voltage is passed to the body of the n-type enhancement mode transistor. Alternatively, if the p-type depletion mode transistor has not been triggered, the n-type enhancement mode transistor remains in floating state. Thus, the range of the snapback voltage can be lowered, enabling the ESD protection circuit to function sooner.

The field oxide layer of the n-type and p-type depletion mode transistors use local oxidation (LOCOS) or a shallow trench isolation oxide layer. The n-type depletion mode transistor uses a phosphorus or arsenic ion implantation. The p-type depletion mode transistor can use a boron ion implantation. Additionally, the floating body ESD protection circuit of the present invention can be used on a bulk ESD protection circuit as well as any of the recently developed SOI technologies.

The floating body ESD protection circuit of the present invention can also use a single, p-type depletion mode transistor to control the n-type enhancement mode transistor. In this case, the source the gate and the body of the other p-type enhancement mode transistor are all coupled to a high voltage, to enable operation. Similarly, a single, n-type depletion mode transistor can be used to control the p-type enhancement mode transistor. In this case, the source, the gate and the body of the other n-type enhancement transistor are coupled to the grounded voltage, to enable operation.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention, and, together with the description, serve to explain the principles of the invention. In the drawings.

DESCRIPTION OF THE PREFERRED EMBODIMENTS

Figure 3:
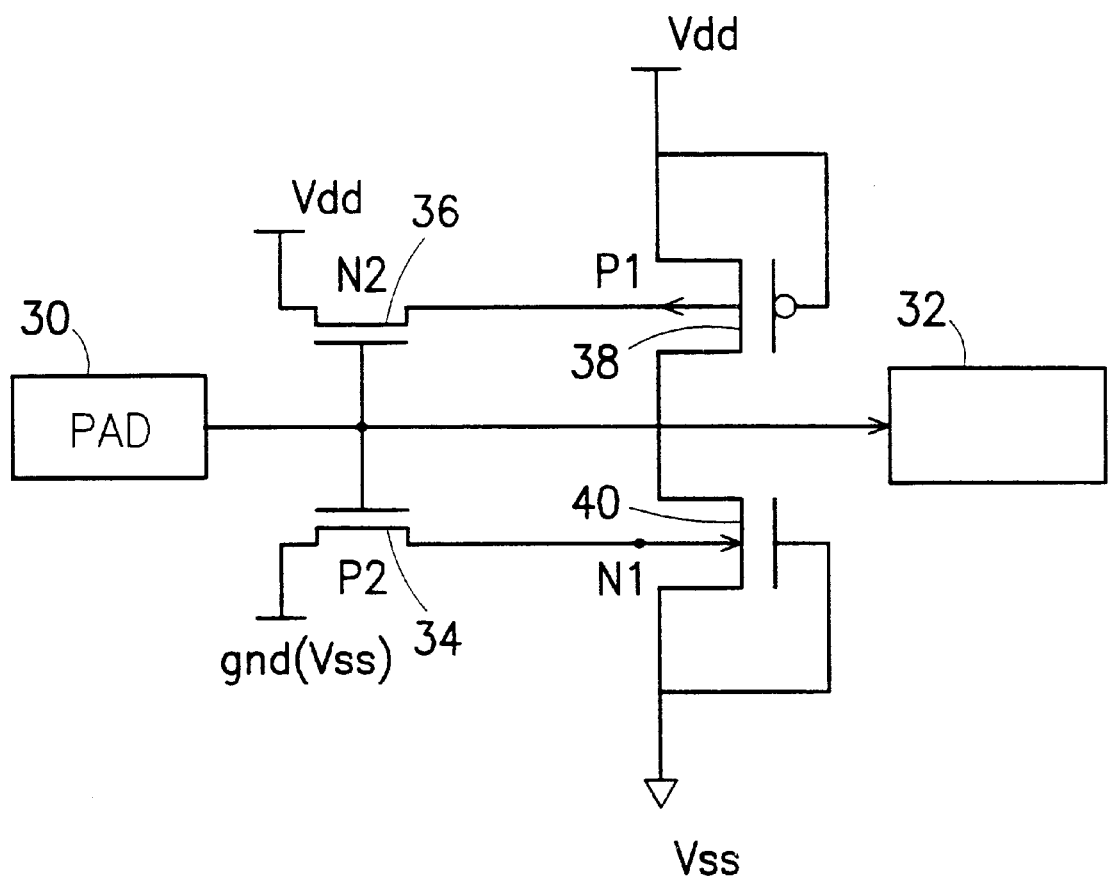
FIG. 3 illustrates a floating body ESD protection circuit according to one preferred embodiment of this invention.

As shown in FIG. 3, a floating body ESD protection circuit is positioned between and coupled to an input-output pad and an internal circuit. The floating body protection circuit includes the structure constituted by p-type depletion mode transistor 34, n-type depletion mode transistor 36, p-type enhancement mode transistor 38 and n-type enhancement mode transistor 40.

The gate of p-type depletion mode transistor 34 mentioned above is coupled to input-output pad 30, the source is coupled to a grounded voltage Vss. The gate of n-depletion mode transistor is also coupled to input-output pad 30. The source is coupled to high voltage Vdd. The source and gate of p-type enhancement mode transistor 38 are coupled to the same high voltage Vdd, the drain is coupled to input-output pad 30. The body is coupled to the drain of the n-type depletion mode transistor 36.

Similarly, the source and gate of the n-type enhancement mode transistor 40 are coupled to voltage Vss, the drain is coupled to I/O pad 30. The body is coupled to the drain of p-type depletion mode transistor 34.

Figure 1:
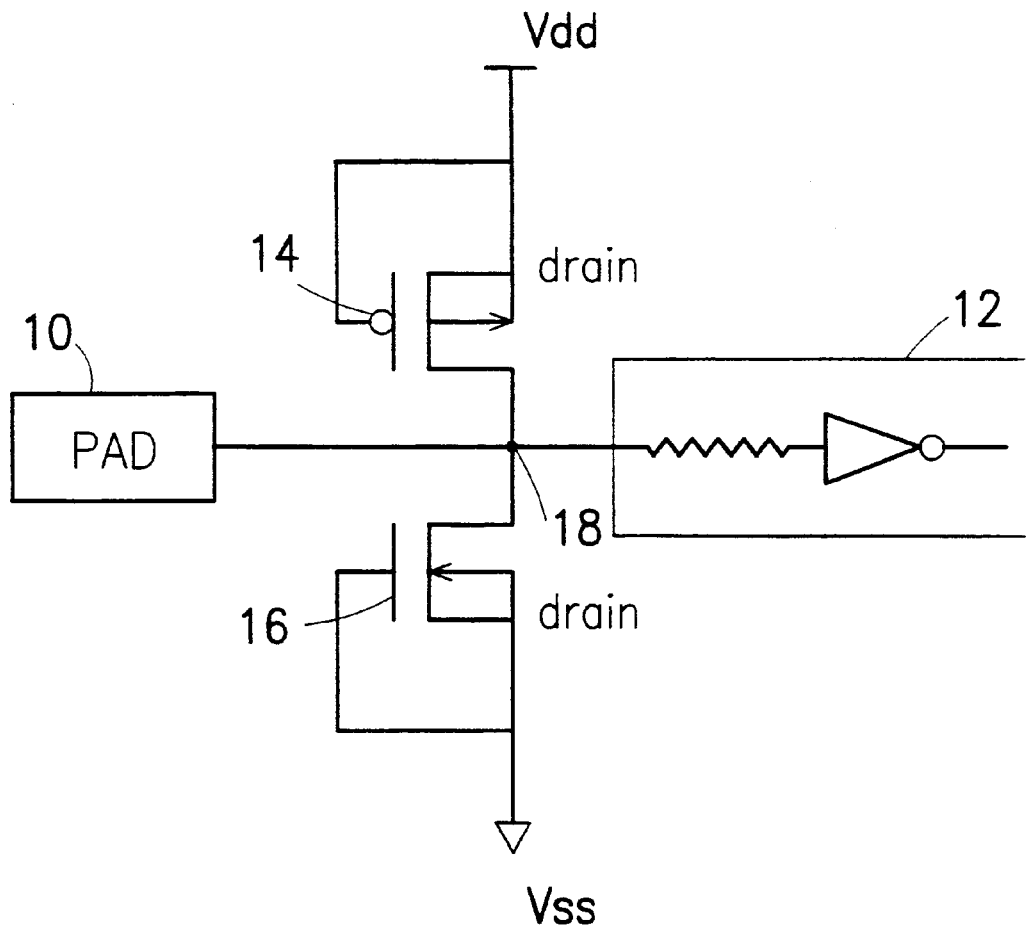
FIG. 1 illustrates a conventional ESD protection circuit.
Figure 2:
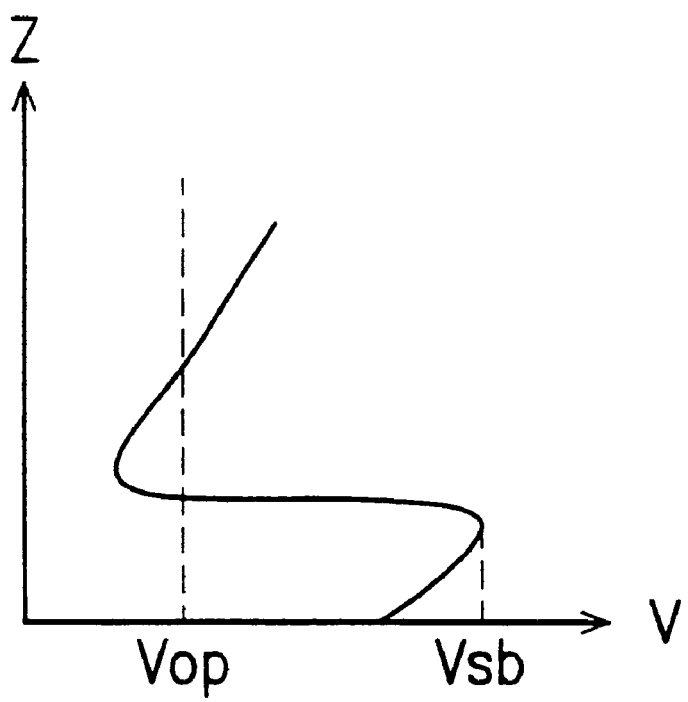
FIG. 2 illustrates the characteristic curve of the transistor shown in FIG. 1.

During operation, when a high negative voltage is applied, p-type depletion mode transistor 34 is triggered. Thus, the drain of p-type depletion mode transistor 34 that is coupled to the grounded voltage Vss, passes the grounded voltage to the substrate of n-type enhancement mode transistor 40 coupled to the drain of p-type depletion mode transistor 34. Thus, n-type enhancement mode transistor 40 and NMOS transistor of FIG. 1 are similar. The substrates are both coupled to the grounded voltage Vss.

Alternatively, if a positive voltage is applied, p-type depletion mode transistor 34 cannot be triggered. Thus, the substrate of n-type enhancement mode transistor 40 is not coupled to a voltage source, leaving the body in a floating state, lowering the range of the snapback voltage. As a consequence ESD protection can occur sooner.

Similarly, when a large positive voltage is applied, n-type depletion mode transistor 36 is triggered. Thus, the source of the n-type depletion mode transistor coupled to a high voltage Vdd, passes the high voltage to the substrate of p-type enhancement mode transistor 38 coupled to n-type depletion mode transistor 36. Thus, p-type enhancement mode transistor 38 and PMOS transistor 40 of FIG. 1 are similar. Both substrates are coupled to the high voltage Vdd.

Alternatively, if a negative voltage is applied, n-type depletion mode transistor 36 cannot be triggered. Thus, the substrate of p-type enhancement mode transistor 38 is not coupled to a voltage source Vdd, leaving the body in a floating state, lowering the range of the snapback voltage. As a consequence ESD protection can occur sooner.

The field oxide layer of n-type depletion mode transistor 38 and p-type depletion mode transistor described above can be a local oxidation method (LOCOS) or shallow trench isolation oxide layer. The n-type depletion mode transistor embodied and broadly described herein can be formed by phosphorus or arsenic ion implantation. The floating body ESD protection circuit of the present invention can not only be used on conventional bulk ESD protection circuits, but can also be used in conjunction with fast developing SOI technologies.

Figure 4:
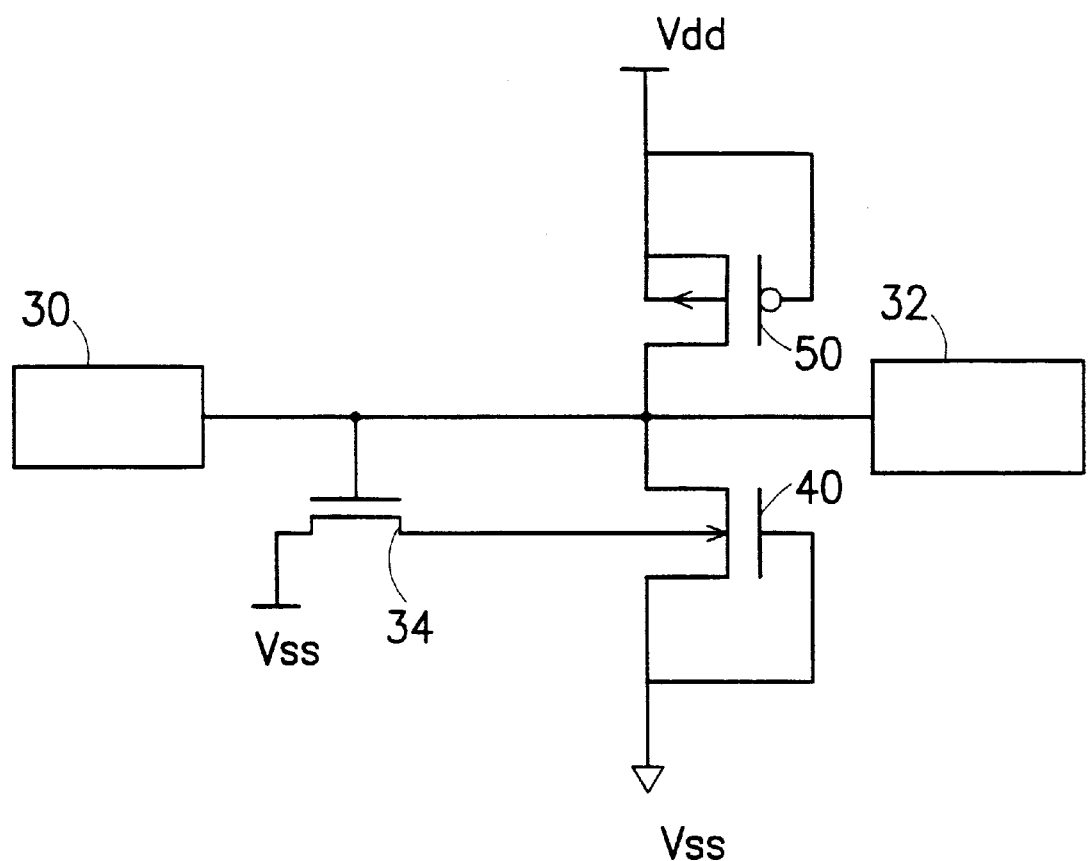
FIG. 4 illustrates a floating body ESD protection circuit according to a second preferred embodiment of this invention.

FIG. 4. illustrates a floating body ESD protection circuit according to a second preferred embodiment of the present invention. The same reference numbers are used in referring to similar devices. The floating body ESD protection circuit is also positioned between and coupled to I/O pad 30 and internal circuit 32. However, the floating body ESD protection circuit of this invention is constituted by a p-type depletion mode transistor 34, a p-type enhancement mode transistor 50, and an n-type enhancement mode transistor 40.

The coupling between p-type depletion mode transistor 34 and n-type enhancement mode transistor 40 is similar to that described in the first embodiment of the invention. The gate of p-type depletion mode transistor 34 is coupled to I/O pad 30. The source is coupled to a grounded voltage Vss. The source and gate of the n-type enhancement mode transistor 40 are both coupled to a grounded voltage Vss. The drain is coupled to I/O pad 30. The substrate coupled to the drain of p-type depletion mode transistor 34 uses the triggering of drain 34 to control whether the body of n-type enhancement mode transistor 40 should be coupled to a high voltage Vdd or be in a floating state. The difference between the first and second embodiments is that the source, the gate and the body of the second are all coupled to a high voltage Vdd and the drain is coupled to I/O pad 30.

When a highly negative charge applied during the operation of the circuit, p-type depletion mode transistor 34 is triggered causing the body of n-type enhancement mode transistor to couple to the grounded voltage Vss. Alternatively, when a positive voltage applied, p-type depletion mode transistor 34 is unable to trigger. Thus, the body of n-type enhancement mode transistor 40 is not coupled to a voltage source, leaving the body in a floating state, lowering the range of the snapback voltage. As a consequence ESD protection can occur sooner.

Figure 5:
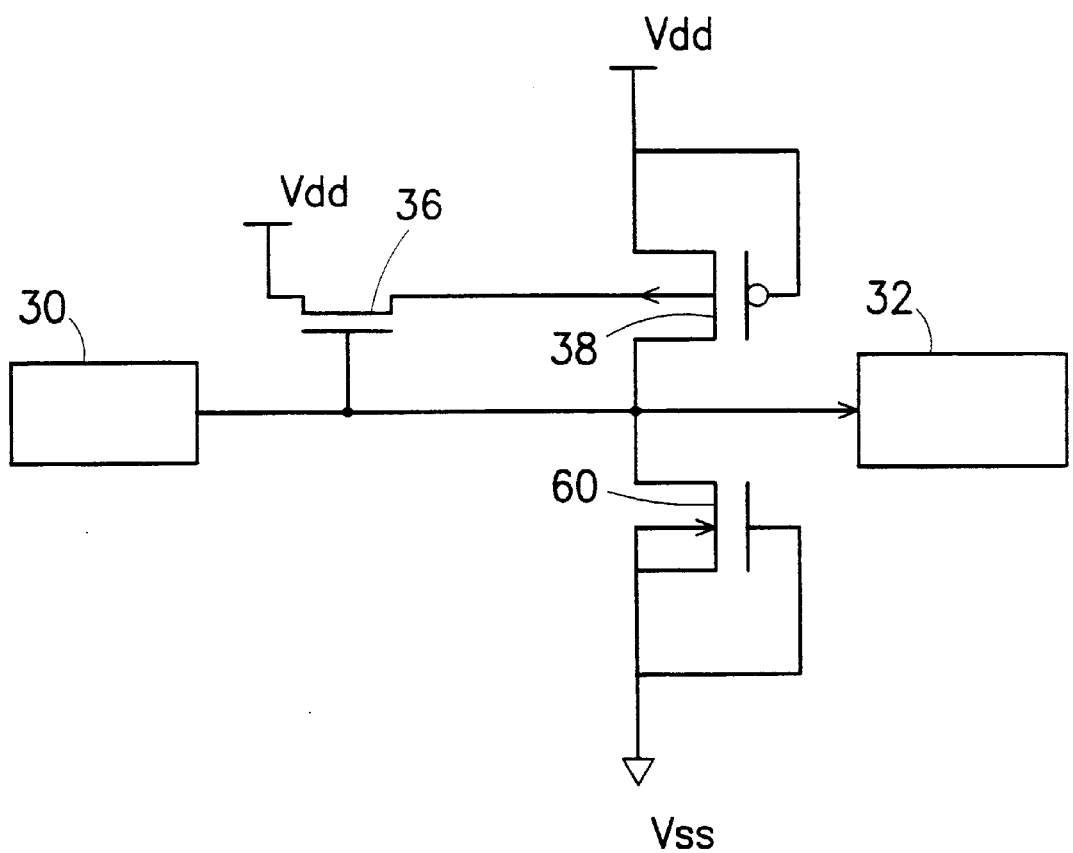
FIG. 5 illustrates a floating body ESD protection circuit according to a third preferred embodiment of this invention.

FIG. 5. illustrates a floating body ESD protection circuit according to a third preferred embodiment of the present invention. The same reference numbers are used in referring to similar devices.

The floating body ESD protection circuit is also positioned between and coupled to I/O pad 30 and internal circuit 32. However, the floating body ESD protection circuit of this invention is constituted by an n-type depletion mode transistor 36, a p-type enhancement mode transistor 38, and an n-type enhancement mode transistor 60.

The coupling between n-type depletion mode transistor 36 and p-type enhancement mode transistor 38 is similar to that described in the first embodiment of the invention. The gate of n-type depletion mode transistor 36 is coupled to I/O pad 30. The source is coupled to a grounded voltage Vss. The source and gate of the p-type enhancement mode transistor 38 are both coupled to a grounded voltage Vdd. The drain is coupled to I/O pad 30. The substrate coupled to the drain of n-type depletion mode transistor 36 uses the triggering of drain 36 to control whether the body of p-type enhancement mode transistor 38 should be coupled to a high voltage Vdd or be in a floating state. The difference between this embodiment and the first embodiment is that the source, the gate and the body in this embodiment are all coupled to a grounded voltage Vss and the drain is coupled to I/O pad 30.

When a highly positive charge is applied during the operation of the circuit, n-type depletion mode transistor 36 is triggered, causing the body of p-type enhancement mode transistor to couple to the high voltage Vdd. Alternatively, when a negative voltage is applied, n-type depletion mode transistor 36 is unable to trigger. Thus, the body of p-type enhancement mode transistor 38 is not coupled to voltage source, leaving the body in a floating state, lowering the range of the snapback voltage. As a consequence ESD protection can occur sooner. N-type depletion mode transistor 60 also functions as an ESD protection circuit.

Figure 6:
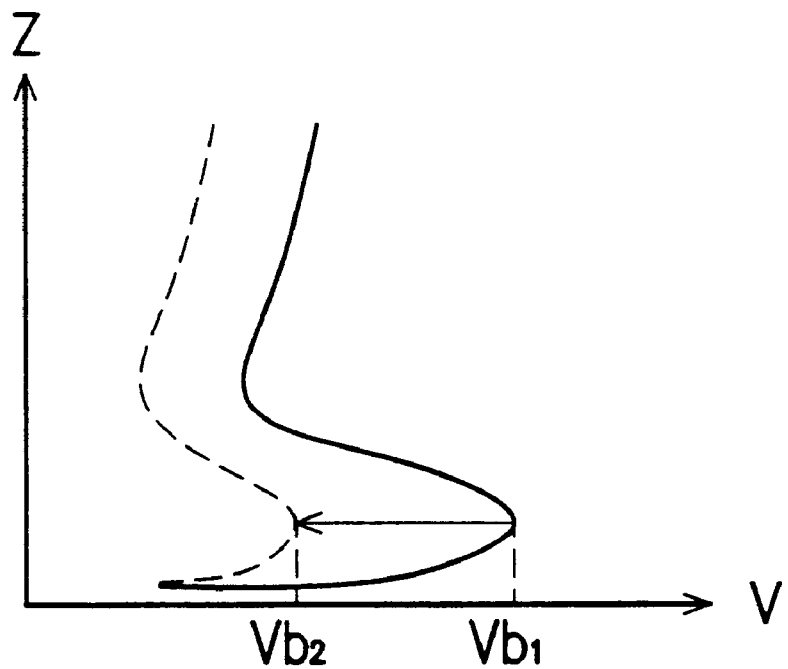
FIG. 6 illustrates the characteristic curve of the floating body ESD protection circuit of the present invention.

The floating body ESD protection circuit embodied and broadly described herein, lowers the range of the snapback voltage. As the contrast between the solid line portion and underlined portion in FIG. 6 shows, snapback voltage drops from Vb1 to Vb2. Thus, ESD protection functions more rapidly, protecting the inner circuit from the affects of sudden excessively high voltage.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A floating body ESD protection circuit, coupled between an I/O pad and an internal circuit, comprising:
    a p-type depletion mode transistor, having a gate coupled to the I/O pad, a source coupled to a grounded voltage, and a drain;
    an n-type depletion mode transistor, having a gate coupled to the I/O pad, a source coupled to a high voltage, and a drain;
    a p-type enhancement mode transistor, having a source and a gate both coupled to the high voltage, a drain coupled to the I/O pad and a substrate coupled to the drain of the n-type depletion mode transistor; and
    an n-type enhancement mode transistor, having a source and a gate both coupled to the grounded voltage, a drain coupled to the I/O pad, and a substrate coupled to the drain of the p-type depletion mode transistor.

2. The circuit of claim 1, wherein the field oxide layer of the n-type depletion mode transistor uses a local oxide (LOCOS) layer.

3. The circuit of claim 1, wherein the field oxide layer of the n-type depletion mode transistor uses a shallow trench isolation oxide layer.

4. The circuit of claim 1, wherein the n-type depletion mode transistor uses a phosporus ion implantation.

5. The circuit of claim 1, wherein the n-type depletion mode transistor uses an arsenic ion implantation.

6. The circuit of claim 1, wherein the field oxide layer of the p-type depletion mode transistor uses a local oxide (LOCOS) layer.

7. The circuit of claim 1, wherein the field oxide layer of the p-type depletion mode transistor uses a shallow trench isolation oxide layer.

8. The circuit of claim 1, wherein the p-type depletion mode transistor uses a boron ion implantation.

9. A floating body ESD protection circuit, coupled between an I/O pad and an internal circuit, comprising:
    a p-type depletion mode transistor, having a gate coupled to the I/O pad, a source coupled to a grounded voltage, and a drain;
    a p-type enhancement mode transistor, having a source, a gate and a substrate together coupled to a high voltage, and a drain coupled to the I/O pad; and
    an n-type enhancement mode transistor, having a source and a gate both coupled to the grounded voltage, a drain coupled to the I/O pad and a substrate coupled to the drain of the p-type depletion mode transistor.

10. The circuit of claim 9, wherein the field oxide layer of the p-type depletion mode transistor uses a local oxide (LOCOS) layer.

11. The circuit of claim 9, wherein the field oxide layer of the p-type depletion mode transistor uses a shallow trench isolation oxide layer.

12. The circuit of claim 9, wherein the p-type depletion mode transistor uses a boron ion implantation.

13. A floating body ESD protection circuit, coupled between an I/O pad and an internal circuit, comprising:
    an n-type depletion mode transistor, having a gate coupled to the I/O pad, a source coupled to a high voltage, and a drain;
    a p-type enhancement mode transistor, having a source and a gate both coupled to the high voltage, a drain coupled to the I/O pad and a substrate coupled to the drain of the n-type depletion mode transistor; and
    an n-type enhancement mode transistor, having a source, a gate and a substrate coupled to a grounded voltage and a drain coupled to the I/O pad.

14. The circuit of claim 13, wherein the field oxide layer of the n-type depletion mode transistor uses a local oxide (LOCOS) layer.

15. The circuit of claim 13, wherein the field oxide layer of the n-type depletion mode transistor uses a shallow trench isolation oxide layer.

16. The circuit of claim 13, wherein the n-type depletion mode transistor uses a phosphorus ion implantation.

17. The circuit of claim 13, wherein the n-type depletion mode transistor uses an arsenic ion implantation.

* * * * *